US009905658B2

(12) United States Patent
Hill et al.

(10) Patent No.: US 9,905,658 B2
(45) Date of Patent: Feb. 27, 2018

(54) TRANSISTORS WITH FIELD PLATES RESISTANT TO FIELD PLATE MATERIAL MIGRATION AND METHODS OF THEIR FABRICATION

(71) Applicants: Darrell G. Hill, Chandler, AZ (US); Stephen H. Kilgore, Chandler, AZ (US); Craig A. Gaw, Scottsdale, AZ (US)

(72) Inventors: Darrell G. Hill, Chandler, AZ (US); Stephen H. Kilgore, Chandler, AZ (US); Craig A. Gaw, Scottsdale, AZ (US)

(73) Assignee: NXP USA, INC., Austin, TX (US)

( * ) Notice: Subject to any disclaimer, the term of this patent is extended or adjusted under 35 U.S.C. 154(b) by 41 days.

(21) Appl. No.: 14/090,327

(22) Filed: Nov. 26, 2013

(65) Prior Publication Data
US 2015/0144953 A1 May 28, 2015

(51) Int. Cl.
*H01L 29/40* (2006.01)
*H01L 29/778* (2006.01)
*H01L 29/49* (2006.01)
*H01L 29/66* (2006.01)
*H01L 29/20* (2006.01)

(52) U.S. Cl.
CPC ........ *H01L 29/402* (2013.01); *H01L 29/4958* (2013.01); *H01L 29/4966* (2013.01); *H01L 29/66462* (2013.01); *H01L 29/7787* (2013.01); *H01L 29/2003* (2013.01)

(58) Field of Classification Search
CPC ....... H01L 29/402–29/108; H01L 2924/01079
See application file for complete search history.

(56) References Cited

U.S. PATENT DOCUMENTS

| 4,816,881 A * | 3/1989 | Boos et al. ................... 257/279 |
| 6,211,568 B1 * | 4/2001 | Hong ............................ 257/754 |
| 7,863,648 B2 * | 1/2011 | Miyamoto et al. ........... 257/192 |
| 7,915,644 B2 | 3/2011 | Wu et al. |
| 8,212,290 B2 | 7/2012 | Heikman et al. |
| 8,410,580 B2 | 4/2013 | Hill et al. |
| 2008/0230786 A1* | 9/2008 | Heikman et al. ............... 257/76 |

(Continued)

FOREIGN PATENT DOCUMENTS

CN          102255243 A *   11/2011

OTHER PUBLICATIONS

Lee, Soo Young. "On the Role of Indium Underlays for the Prevention of Thermal Grooving in Thin Gold Films." Dec. 1985. The Institutional Repository at the University of Florida.*

(Continued)

*Primary Examiner* — Stephen Bradley
(74) *Attorney, Agent, or Firm* — Sherry W. Schumm (57) ABSTRACT

An embodiment of a transistor includes a semiconductor substrate, spaced-apart source and drain electrodes coupled to the semiconductor substrate, a gate electrode coupled to the semiconductor substrate between the source and drain electrodes, a dielectric layer over the gate electrode and at least a portion of the semiconductor substrate, and a field plate structure over the dielectric layer, wherein the field plate structure includes a gold-containing material and one or more migration inhibiting materials.

11 Claims, 5 Drawing Sheets

(56) References Cited

U.S. PATENT DOCUMENTS

| | | | | |
|---|---|---|---|---|
| 2009/0237886 | A1* | 9/2009 | Iwai | H01L 23/373 361/708 |
| 2012/0280363 | A1* | 11/2012 | Sumida | C30B 25/04 257/615 |
| 2013/0234298 | A1* | 9/2013 | Mitsugi | B23K 26/18 257/629 |
| 2013/0320540 | A1* | 12/2013 | Chiu | H01L 21/76898 257/751 |

OTHER PUBLICATIONS

English Translation of CN102255243, Nov. 23, 2011, Escapenet.*
Hummel et. al., "The Role of Thermal Grooving, Thermotransport and Electrotransport on the Failure of Thin Film Metallizations", 22nd Annual Reliability Physics Symposium, Apr. 1984, pp. 234-241.

* cited by examiner

TRANSISTORS WITH FIELD PLATES RESISTANT TO FIELD PLATE MATERIAL MIGRATION AND METHODS OF THEIR FABRICATION

TECHNICAL FIELD

Embodiments relate generally to transistors that include field plates and methods of their fabrication.

BACKGROUND

High electron mobility transistors (HEMTs) have been found to be particularly well suited for high frequency (e.g., radio frequency), high power applications. Some types of HEMTs (e.g., certain gallium nitride (GaN) based HEMTs) include a conductive field plate adjacent to but electrically isolated from the device's gate. The field plate may be electrically coupled to the device's source electrode, for example, and this arrangement may serve to improve device performance by reducing the peak electric field in the transistor. As technologies related to GaN HEMTs continue to develop, device designers continue to seek additional ways for further improving the performance and reliability of such devices.

DETAILED DESCRIPTION

During high frequency and/or high temperature operation of a conventional transistor that includes a field plate, the conventional field plate materials may migrate or become redistributed over time. For example, migration of the field plate materials may be the result of electromigration (i.e., the redistribution of a metal material caused by atom and/or ion transport as a result of high current density), thermomigration (i.e., the redistribution of a metal material caused by a high temperature gradient), stress migration (i.e., the redistribution of a metal material to relieve internal stresses of the metal), grain boundary grooving (i.e., redistribution of metal material caused by an imbalance of surface tension which occurs where grain boundaries meet free surfaces), and/or other phenomenon. Eventually, the migration of the field plate materials may detrimentally affect device performance and, in some cases, may cause the device to fail.

The inventive subject matter discussed herein is directed toward embodiments of a transistor that includes a field plate structure formed from a combination of materials that inhibits migration of the field plate materials when the transistor is operated at high frequencies and/or is exposed to or generates high temperatures. More specifically, the combination of field plate materials is less susceptible to migration when compared with conventional field plate materials. The use of the various embodiments of migration inhibiting materials discussed herein within a field plate structure may result in increased device reliability and performance during the operational life of a transistor.

Embodiments of field plates discussed herein may be used with a variety of transistor structures or other devices, including a variety of wide bandgap transistor structures. According to a particular embodiment, a field plate comprising migration inhibiting materials may be used in a high electron mobility transistor (HEMT), such as a gallium nitride (GaN) based HEMT. Although a particular embodiment of a GaN based HEMT is discussed in detail herein, those of skill in the art would understand, based on the description herein, that the various field plate embodiments may be used in GaN based HEMTs having different structural configurations from those illustrated, or may be used in transistors other than HEMTs and/or non-GaN based transistors.

Figure 1:
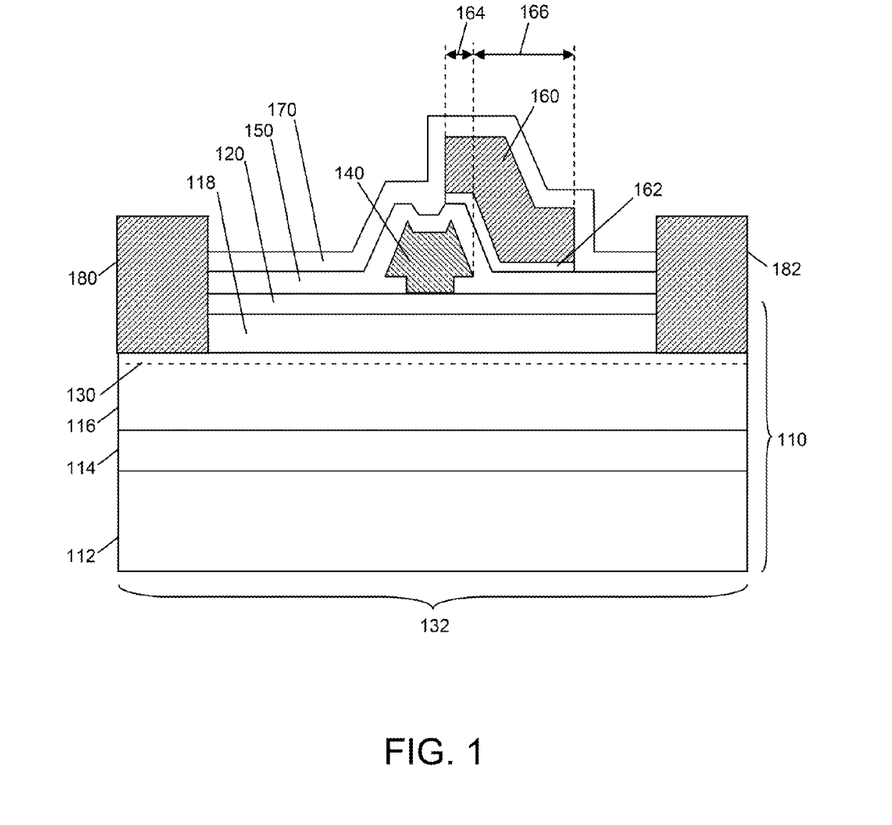
FIG. 1 is a cross-sectional view of a transistor, in accordance with an example embodiment.

FIG. 1 is a cross-sectional view of a transistor 100 that includes a field plate structure 160 that may be less susceptible to migration (e.g., due to thermomigration, electromigration, stress migration, grain boundary grooving, and/or other phenomenon) than a conventional field plate, in accordance with an example embodiment. Transistor 100 includes a substrate 110, a gate electrode 140, source and drain electrodes 180, 182, a first dielectric layer 150, and a field plate structure 160, in an embodiment.

The semiconductor substrate 110 may include a host substrate 112, a buffer layer 114, a channel layer 116, a barrier layer 118, and a cap layer 120. In an embodiment, the host substrate 112 includes silicon carbide (SiC). In other embodiments, the host substrate 112 may include other materials such as sapphire, silicon (Si), GaN, aluminum nitride (AlN), diamond, poly-SiC, silicon on insulator, gallium arsenide (GaAs), indium phosphide (InP), zinc oxide, spinet, and other substantially insulating or high resistivity materials, including other materials capable of supporting growth of a group-III nitride material. Although the term "layer," in the singular, may be used herein, it is to be understood that a "layer" of a particular type may include one or more constituent layers of material of that type (e.g., a "dielectric layer" may include one or more layers of dielectric material, a "layer" of a gold-containing material may include one or more layers of gold-containing material, a "layer" of a migration inhibiting material may include one or more layers of migration inhibiting materials, and so on).

The buffer layer 114 is formed on the upper surface of the host substrate 112, and may serve to reduce the lattice mismatch between the host substrate 112 and the channel layer 116. The buffer layer 114 may include one or more group III-nitride semiconductor layers. For example, the buffer layer 114 may include at least one aluminum gallium nitride (AlGaN) mixed crystal layer having a composition denoted by $Al_XGa_{1-X}N$ with an aluminum mole fraction, X, that can take on values between 0 and 1. For example, the buffer layer 114 may include a nucleation region comprised of AlN at the interface with the host substrate 112, and additional $Al_XGa_{1-X}N$ regions formed over the nucleation region. In addition or alternatively, the buffer layer 114 may include other nitrogen (N)-face or gallium (Ga)-face materials, indium gallium nitride (InGaN), Si, GaAs, InP, or other suitable materials. The total thickness of the buffer layer 114 may be between about 200 angstroms and about 100,000 angstroms although other thicknesses may be used.

Channel layer 116 is formed over the buffer layer 114. The channel layer 116 may include one or more group III nitride semiconductor layers. The channel layer 116 may include an $Al_XGa_{1-X}N$ layer where X takes on values between 0 and 1. In an embodiment, the channel layer 116 is configured as GaN (X=0) although other values of X may be used, as well. The thickness of the channel layer 116 may be between about 50 angstroms and about 10,000 angstroms though other thicknesses may be used. The channel layer 116 may be not intentionally doped (NID) or, alternatively, may include Si, germanium (Ge), carbon (C), iron (Fe), chromium (Cr), or other suitable dopants. In other embodiments, the channel layer 116 may include NID or doped $In_YGa_{1-Y}N$, where Y, the indium mole fraction, may take a value between 0 and 1.

A barrier layer 118 is formed over the channel layer 116 in accordance with an embodiment. The barrier layer 118 may include one or more group III nitride semiconductor layers. In some embodiments, the barrier layer 118 has a larger bandgap and larger spontaneous polarization than the channel layer 116 and, when the barrier layer 118 is in direct contact with the channel layer 116, a channel is created in the form of a two dimensional electron gas (2-DEG) 130 within the channel layer 116 near the interface between the channel layer 116 and the barrier layer 118 (i.e., at the heterointerface between the barrier layer 118 and the channel layer 116). In addition, strain between the barrier layer 118 and channel layer 116 may cause additional piezoelectric charge to be introduced into the 2-DEG 130 and channel.

The barrier layer 118 may include at least one $Al_XGa_{1-X}N$ layer where X takes on values between 0 and 1. In some embodiments, X may take a value of 0.1 to 0.35, although other values of X may be used. In other embodiments, the barrier layer 118 may include indium aluminum nitride (InAlN) layers, denoted $In_YAl_{1-Y}N$, where Y, the indium mole fraction, may take a value between about 0.1 and about 0.2 though other values of Y may be used. The thickness of the barrier layer 118 may be between about 50 angstroms and about 2000 angstroms though other thicknesses may be used. The barrier layer 118 may be NID or, alternatively, may include Si, Ge, C, Fe, Cr, or other suitable dopants. According to an embodiment, there may be an additional AlN interbarrier layer (not shown) formed between the channel layer 116 and the barrier layer 118, in some embodiments.

In the embodiment illustrated in FIG. 1, a cap layer 120 may be formed over the barrier layer 118. The cap layer 120 may be configured to present a stable surface of the semiconductor substrate 110 and may serve to protect the surface of the semiconductor substrate 110 from chemical and environmental exposure incidental to wafer processing. For example, the cap layer 120 may include one or more group III nitride semiconductor layers. In an embodiment, the cap layer 120 is GaN. The cap layer 120 may be NID or, alternatively, may include Si, Ge, C, Fe, Cr, or other suitable dopants. The thickness of the cap layer 120 may be between about 5 angstroms and about 100 angstroms though other thicknesses may be used. In an alternate embodiment, the cap layer 120 may be excluded.

The above-described choice of materials and arrangement of layers to form semiconductor substrate 110 should not be construed to be limiting. For example, the function and operation of the various layers may be combined and may change depending on the materials used in any specific embodiment. For example, in other embodiments using N-polar materials (not shown) the channel layer (e.g., channel layer 116) may be disposed over the barrier layer (e.g., barrier layer 118) to create a 2-DEG and channel directly underneath an optional cap layer and gate electrode (e.g., gate electrode 140). In still other embodiments, the substrate may include semiconductor layers formed from materials including GaAs, aluminum gallium arsenide (AlGaAs), indium gallium arsenide (InGaAs), and aluminum indium arsenide (AlInAs).

In an embodiment, a gate electrode 140 is formed over the semiconductor substrate 110 in an active region 132. The gate electrode 140 is electrically coupled to the channel through the cap layer 120 and barrier layer 118. Changes to the electric potential on the gate electrode 140 shifts the quasi Fermi level for the barrier layer 118 compared to the quasi Fermi level for the channel layer 116 and thereby modulate the electron concentration in the channel within the semiconductor substrate 110 under the gate electrode 140.

The gate electrode 140 may be formed from any of a number of materials, including but not limited to titanium (Ti), aluminum (Al), gold (Au), nickel (Ni), platinum (Pt), chromium (Cr), tungsten (W), and alloys thereof. According to an embodiment, the gate electrode 140 is configured as a Schottky gate and may be formed over and directly in contact with the cap layer 120 of the semiconductor substrate 110 using a Schottky material layer and a conductive metal layer (not distinctly indicated). In other embodiments, the gate electrode 140 may be formed over a gate dielectric or gate oxide forming a metal-insulator-semiconductor (MIS) junction or metal oxide semiconductor (MOS) junction, electrically coupling to the channel through the dielectric or oxide layer. The gate electrode 140 may have a T-shaped cross section with a vertical stem, as illustrated in FIG. 1. Alternatively, the gate electrode 140 may have a substantially square cross sectional shape, a gamma ('I) shape, or another cross sectional shape, in other embodiments. In still other embodiments, the gate electrode 140 may be recessed through the cap layer 120 and extend partially into the barrier layer 118, increasing the electrical coupling of the gate electrode 140 to the channel through the barrier layer 118.

A first dielectric layer 150 (or spacer layer) is formed over the semiconductor substrate 110 in order to electrically insulate the subsequently formed field plate structure 160 from the gate electrode 140. In an embodiment in which the field plate structure 160 partially overlaps the gate electrode 140, the first dielectric layer 150 is formed at least partially over the gate electrode 140 and at least partially over the top surface of the semiconductor substrate 110. For example, as shown in FIG. 1, the first dielectric layer 150 is formed entirely over the gate electrode 140 and over the surface of the cap layer 120 between the gate electrode 140 and the source and drain electrodes 180, 182, respectively. In an alternate embodiment, the first dielectric layer 150 may not be formed entirely over the gate electrode 140 and/or over the entire surface of the semiconductor substrate 110. In addition, in an embodiment in which the field plate structure 160 does not overlap the gate electrode 140, such as the embodiment shown in FIG. 8, the first dielectric layer 150 need not be formed over the gate electrode 140, although it may be. According to an embodiment, the first dielectric layer 150 may have a total thickness of between about 100 and about 20,000 angstroms although other thickness values may be used.

In various embodiments, the first dielectric layer 150 may be formed from one or more materials (e.g., one or more layers of different materials). For example, the first dielectric layer 150 may include one or more layers of silicon nitride ($Si_3N_4$), silicon dioxide ($SiO_2$), silicon oxynitride (SiON), aluminum oxide ($Al_2O_3$), a combination of these, or other suitable insulating dielectric materials. In addition or alternatively, first dielectric layer 150 may include one or more layers of a group III nitride material having different group III elements (e.g., alloys of Al, Ga, or In). For example, the one or more layers may include one or more layers of $Al_xGa_{1-x}N$ with an aluminum mole fraction, X, that can take on values between 0 and 1, although the $Al_xGa_{1-x}N$ is restricted from overlying the gate electrode 140, in an embodiment.

A field plate structure 160 is formed over the first dielectric layer 150, with an optional adhesion layer 162 (e.g., formed of titanium (Ti), titanium nitride (TiN), chromium (Cr), or some other material) between the first dielectric layer 150 and the field plate structure 160. The adhesion layer 162 may have a thickness between about 50 angstroms and about 1000 angstroms, in an embodiment, although the adhesion layer 162 may be thicker or thinner or excluded altogether, in other embodiments.

According to an embodiment, the field plate structure 160 is formed from gold (Au) or a gold alloy (e.g., titanium-gold (Ti/Au), nickel-gold (Ni/Au), or another alloy), collectively referred to herein as a "gold-containing material," and one or more migration inhibiting materials. In the context of the various embodiments, a "migration inhibiting material" is a material that has a reduced tendency for the materials of field plate structure 160 to migrate when compared with a field plate that is formed without the material (e.g., a field plate of pure gold or a gold alloy). According to various embodiments, the migration inhibiting materials may be materials that inhibit thermomigration, electromigration, stress migration, grain boundary grooving, and/or other types of migration of the materials of the field plate structure 160. The migration inhibiting materials may include one or more materials selected from indium (In), nickel (Ni), chromium (Cr), molybdenum (Mo), niobium (Nb), TiN, titanium tungsten (TiW), titanium tungsten nitride (TiWN), or other materials that have the characteristic of inhibiting migration of a gold-containing material. In embodiments in which the adhesion layer 162 is excluded, the field plate structure 160 may include a layer of a migration inhibiting material that is deposited over the first dielectric layer 150 as a bottom layer of the field plate structure 160, where the migration inhibiting material also has good adhesion properties. In such an embodiment, the migration inhibiting material selected for the bottom layer of the field plate structure may perform essentially the same function as the excluded adhesion layer 162, while also functioning to inhibit migration of the overlying gold-containing material.

According to an embodiment, the field plate structure 160 includes the gold-containing material in a range of about 60 to about 95 percent by volume, and includes the one or more migration inhibiting materials in a range of about 5 to about 40 percent by volume. In alternate embodiments, the ratios of gold-containing material to migration inhibiting material may be different from the above-indicated ranges. As will be explained in more detail below, the gold-containing material and the migration inhibiting material(s) may form a homogeneous structure (e.g., the materials are completely melted or diffused together), in an embodiment. Alternatively, in other embodiments, they may be partially combined (e.g., partially diffused together) or layered (e.g., not significantly combined or diffused together). For example, an embodiment may include a layer of indium as the migration inhibiting material deposited over the first dielectric layer 150, and one or more layers of a gold-containing material deposited over the layer of indium. When more than one gold-containing material layer is used, additional layers of indium may be interleaved with the gold-containing material layers. Another embodiment may include a layer of TiW as the migration inhibiting material deposited over the first dielectric layer 150, and one or more layers of a gold-containing material deposited over the layer of TiW. When more than one gold-containing material layer is used, additional layers of TiW may be interleaved with the gold-containing material layers.

Figure 8:
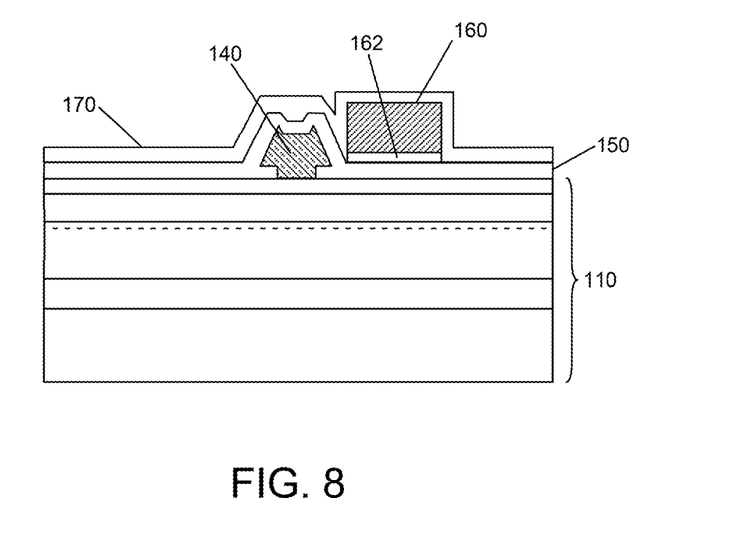
FIG. 8 is a cross-sectional view of a transistor, in accordance with another example embodiment.

As shown in FIG. 1, the field plate structure 160 may at least partially overlap the periphery of the gate electrode 140, in an embodiment. More particularly, in FIG. 1, the field plate structure 160 is shown to overlap the gate electrode 140 by a distance 164. In various alternate embodiments, the field plate structure may either completely overlap (or cover) the gate electrode 140, or the field plate structure may be adjacent to but not overlap the gate electrode 140, as shown in FIG. 8. In any event, some portion of the first dielectric layer 150 is present between the field plate structure 160 and the gate electrode 140. According to an embodiment, the field plate structure 160 also extends a distance 166 over the top surface of the substrate 110 toward drain electrode 182. The thickness of the field plate structure 160 is in a range of about 2000 angstroms to about 7000 angstroms in an embodiment, although the field plate structure 160 may be thicker or thinner, as well.

A second dielectric layer 170 is formed over the first dielectric layer 150 and the field plate structure 160. Essentially, the second dielectric layer 150 encapsulates the active region 132, protecting the surface of the transistor 100 from moisture and other contaminants. The second dielectric layer 170 may include one of $Si_3N_4$, $SiO_2$, SiON, $Al_2O_3$, a combination of these, or other suitable insulating dielectric layer(s). The second dielectric layer 170 may have a total thickness of between about 100 and about 20,000 angstroms although other thickness values may be used.

Transistor 100 also includes source and drain electrodes 180, 182 that are spaced-apart over the semiconductor substrate 110, and the gate electrode 140 is positioned between the source and drain electrodes 180, 182. According to an embodiment, both source and drain electrodes 180, 182 may be ohmic contacts (i.e., contacts that have an ohmic junction with the channel). In such an embodiment, the source and drain electrodes 180, 182 may be formed from one or more of a number of materials, including but not limited to Ti, Al, Au, Ni, Pt, Cr, W, and alloys thereof. In an embodiment, the source and/or drain electrodes 180, 182 may include a multi-layer stack metal layer of Ti, Al, Mo, and Au although other suitable materials known in the art may be used. In some embodiments, one or more of the Ti, Al, Mo, or Au layers may be omitted or substituted for other suitable materials.

In alternate embodiments, either or both source and/or drain electrode 180, 182 may include a Schottky contact. In such an embodiment, the Schottky contact may include multiple layers. For example, a first metal layer that contacts semiconductor substrate 110 may include Ni, Pt, Cr, W, Ti, copper (Cu), palladium (Pd), iridium (Ir), rhenium (Re), or nickel silicide ($Ni_xSi_y$), a combination of these, or other suitable high work function materials. One or more conductive layers may be deposited over the first metal layer, including substantially conductive layers that may include one or more of Au, Ag, Al, Cu, or other substantially conductive materials. Optionally, barrier metal layer(s) may be deposited after the first metal layer and before the conductive metal layer(s), where the barrier metal layer(s) may include materials such as Ni, Pt, Cu, Pd, Cr, W, Ir, $Ni_xSi_y$ or other substantially refractive materials that act as a barrier between the first metal layer that contacts semiconductor substrate and the conductive layer(s).

In the embodiment illustrated in FIG. 1, the source and drain electrodes 180, 182 are recessed through the barrier layer 118, the cap layer 120, and the first and second dielectric layers 150, 170, and the source and drain electrodes 180, 182 directly contact the channel layer 116. In alternate embodiments, the source and drain electrodes 180, 182 may extend only partially through the barrier layer 118, or may extend only through the cap layer 120, or may be formed over and in contact with the cap layer 120. In still other alternate embodiments, ion implantation may be used to form ohmic contact to the channel.

Transistor 100 is an "always on" type of HEMT (e.g., a pseudomorphic HEMT or "pHEMT"), meaning that, during operation of the transistor 100, electric current may flow between the source and drain electrodes 180, 182 through the 2-DEG 130 when the gate electrode 140 is biased at an appropriate level for current conduction. Conversely, the gate also may be biased to inhibit current conduction between the source and drain electrodes 180, 182 through the 2-DEG 130. In an alternate embodiment, a transistor that includes an embodiment of a field plate such as the embodiments discussed herein may be an "always off" type of HEMT that includes a two dimensional hole gas (2-DHG) at a heterointerface between a channel layer and a barrier layer.

Figure 2:
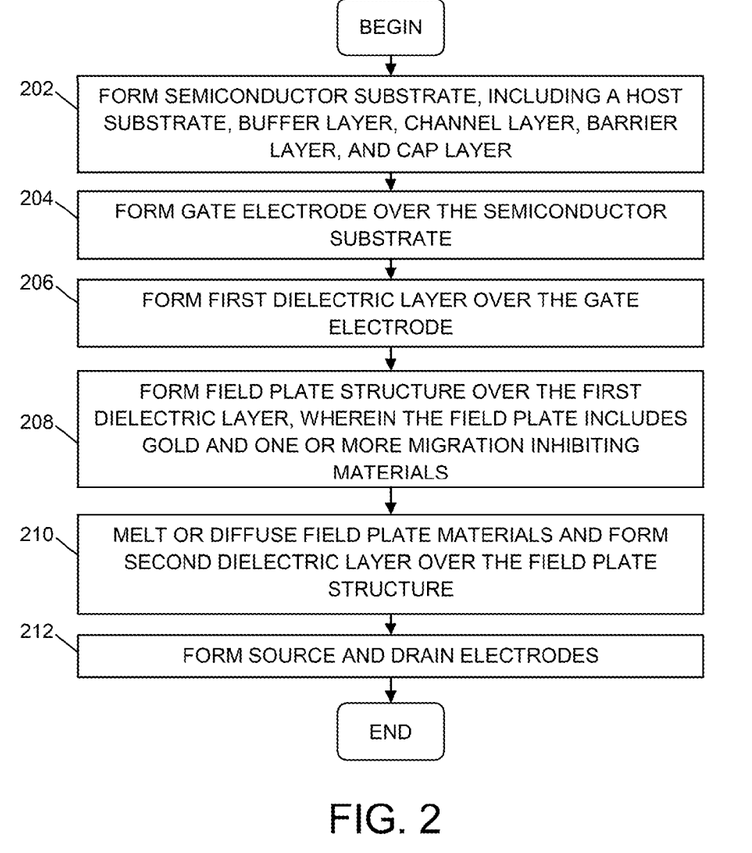
FIG. 2 is a flowchart of a method for fabricating a transistor, in accordance with an example embodiment.

FIG. 2 is a flowchart of a method for fabricating a transistor (e.g., transistor 100, FIG. 1), in accordance with an example embodiment. FIG. 2 should be viewed in conjunction with FIGS. 3-7, which are cross-sectional views of transistor 100 of FIG. 1 during various stages of fabrication, in accordance with various example embodiments.

Figure 3:
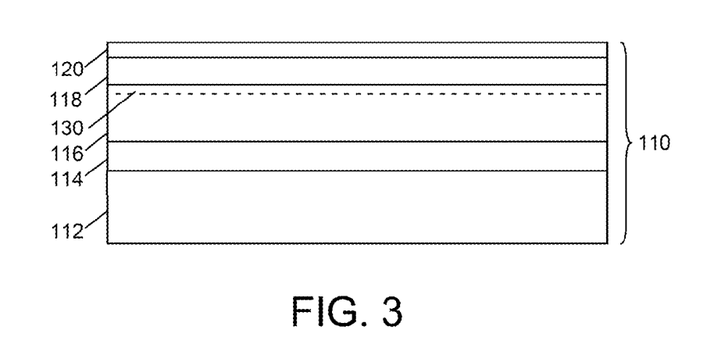
FIGS. 3-7 are cross-sectional views of the transistor of FIG. 1 during various stages of fabrication, in accordance with various example embodiments.

Referring to FIGS. 2 and 3, the method may begin, in block 202, by forming a semiconductor substrate (e.g., semiconductor substrate 110). As discussed previously, according to an embodiment, the semiconductor substrate may include a host substrate 112, a buffer layer 114, a channel layer 116, a barrier layer 118, and a cap layer 120. According to an embodiment, each of the buffer layer 114, channel layer 116, barrier layer 118, and cap layer 120 may be may be grown over an upper surface of host substrate 112 using one of metal-organo chemical vapor deposition (MOCVD), molecular beam epitaxy (MBE), hydride-vapor phase epitaxy (HVPE) or a combination of these techniques, though other suitable techniques alternatively may be used. As discussed previously, a 2-DEG 130 is present within the channel layer 116 near the interface between the channel layer 116 and the barrier layer 118.

Figure 4:
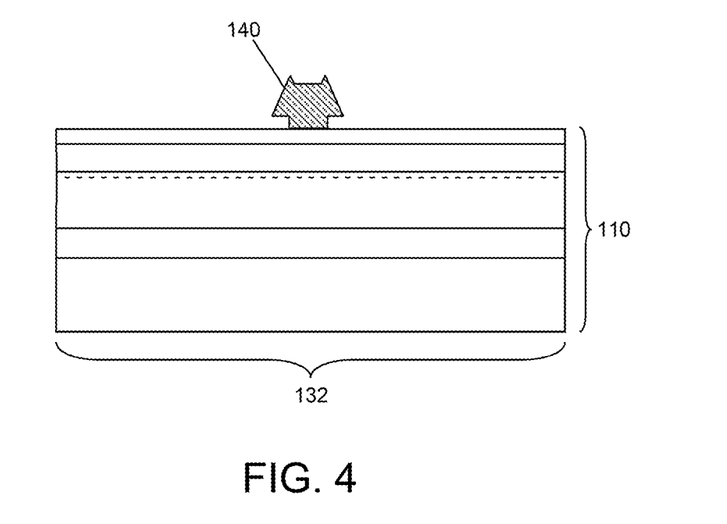

Referring to FIGS. 2 and 4, in block 204, a gate electrode 140 is formed over the semiconductor substrate 110 in an active region 132. As discussed previously, the gate electrode 140 may be configured as a Schottky gate, and may have a T-shaped cross section with a vertical stem, as illustrated in FIG. 4. In such an embodiment, the shape of the gate electrode 140 may be established by applying a resist layer (not illustrated) over the semiconductor substrate 110, patterning and etching the resist layer to form an opening that exposes a portion of the surface of the semiconductor substrate 110 on which the gate electrode 140 will be formed, additionally processing the resist layer to form a retrograde profile for sidewalls of the resist layer within the opening, and depositing a gate electrode layer (which may include multiple sub-layers) over the resist layer and within the opening. In an embodiment, the one or more layers used to form gate electrode layer may be deposited by evaporation, sputtering, plating, physical vapor deposition (PVD), atomic layer deposition (ALD), or other suitable deposition technique(s). Forming the gate electrode 140 may further include performing a "lift-off" technique to remove the resist layer and the portions of the gate electrode layer overlying the resist layer. The gate electrode may then be annealed, in an embodiment.

In alternate embodiments in which the gate electrode 140 has a substantially square cross sectional shape, a gamma ('T) shape, or another cross sectional shape, variations of the above-described gate electrode formation technique may be employed. In addition, in an embodiment in which the gate electrode 140 is recessed through the cap layer 120 and extends partially into the barrier layer 118, an additional etching process that is selective to the materials of the cap layer 120 and the barrier layer 118 may be performed prior to depositing the gate electrode layer. In still other embodiments, the gate electrode 140 may form a portion of a MIS junction or a MOS junction, and suitable gate electrode layer materials and gate electrode 140 formation techniques may be employed to form those junctions. In still another embodiment, the gate electrode 140 may be formed after forming the first dielectric layer 150, and an additional etching process that is selective to the material of the first dielectric layer 150 may be performed prior to depositing the gate electrode layer, in order to expose the portion of the top surface of the semiconductor substrate 110 on which the gate electrode 140 is formed.

Figure 5:
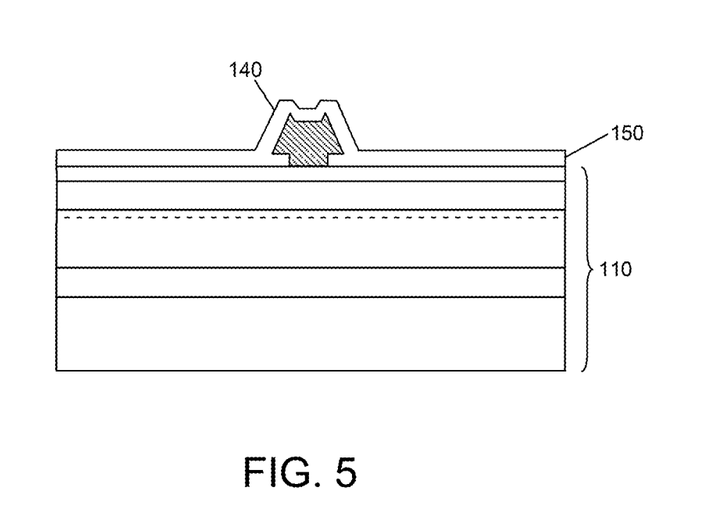

Referring to FIGS. 2 and 5, in block 206, a first dielectric layer 150 is formed over the semiconductor substrate 110. In an embodiment in which the field plate structure 160 (which is subsequently formed in block 208) partially overlaps the gate electrode 140, the first dielectric layer 150 is formed at least partially over the gate electrode 140 and at least partially over the top surface of the semiconductor substrate 110. In an alternate embodiment in which the field plate structure 160 does not overlap the gate electrode 140, the first dielectric layer 150 need not be formed over the gate electrode 140, although it may be. The first dielectric layer 150 may be epitaxially grown, or alternatively may be formed, for example, using plasma-enhanced chemical vapor deposition (PECVD), ALD, inductively-coupled plasma deposition (ICP), electron cyclotron resonance CVD (ECR-CVD), Cat-CVD, HWCVD, sputtering, or another suitable deposition technique.

Figure 6:
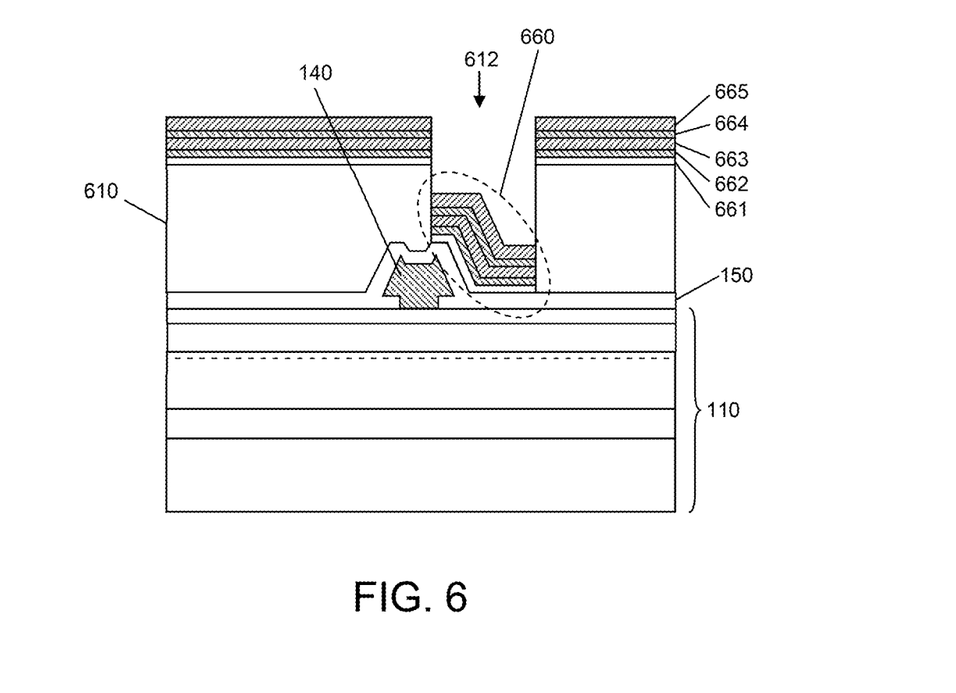
Figure 7:
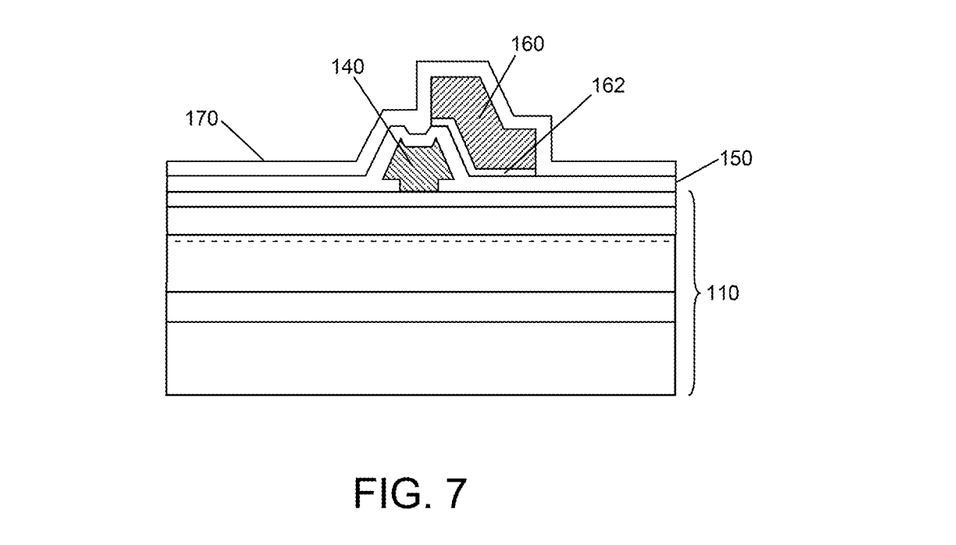

Referring to FIGS. 2, 6, and 7, in blocks 208 and 210, a field plate structure 160 is formed over the first dielectric layer 150. Referring first to FIG. 6, formation of the field plate structure 160 may first include applying a resist layer 610 over the first dielectric layer 150, and patterning and etching the resist layer 610 to form an opening 612 that exposes a portion of the surface of the first dielectric layer 150 over which the field plate structure 160 will be formed. The position and size of the opening 612 corresponds to the periphery of the field plate structure 160 to be formed.

The materials comprising the field plate structure 160 may then be deposited over the resist layer 610 and the portion of the first dielectric layer 150 that is exposed through the opening 612. According to an embodiment, an adhesion layer 661 first may be deposited over the resist layer 610, with the portion of the adhesion layer 661 deposited within the opening 612 forming the adhesion layer 162 that ultimately will underlie the field plate structure 160. In an alternate embodiment, the adhesion layer 661, 162 may be excluded.

According to an embodiment, a stack of field plate layers 662-665 may then be deposited over the resist layer 610. According to an embodiment, the stack of field plate layers 662-665 may include one or more layers of one or more gold-containing materials 663, 665 (referred to generally as "gold-containing layers"), and one or more layers of one or more migration inhibiting materials 662, 664. In the embodiment illustrated in FIG. 6, the stack of field plate layers includes two migration inhibiting material layers 662, 664 interleaved with two gold-containing layers 663, 665. More specifically, from bottom to top in FIG. 6, the stack of field plate layers includes a first migration inhibiting material layer 662, a first gold-containing layer 663, a second migration inhibiting material layer 664, and a second gold-containing layer 665. In other embodiments, the stack of field plate layers may include different numbers of migration inhibiting material layers (e.g., one or more than two) and/or different numbers of gold-containing layers (e.g., one or more than two), and/or the layers may be stacked in a different order. According to an embodiment, the thicknesses and compositions of the various field plate layers 662-665 are selected to minimize stress within the stack over a relatively wide temperature range, thus reducing the potential for stress migration of the field plate materials. In other alternate embodiments, the gold-containing material and the migration inhibiting material may be interspersed in an arrangement other than a stacked arrangement (e.g., strips or bands of the different materials may be laid down which alternate in a horizontal direction, rather than a vertical direction). In still another alternate embodiment, the gold-containing material and the migration inhibiting material may be combined (e.g., melted together) prior to deposition of the combined field plate material over the resist layer 610 and within the opening 612.

In any event, the quantities of gold-containing materials and the migration inhibiting materials deposited within the opening result in a combination of field plate materials that includes about 60 to about 95 percent by volume of the gold-containing materials, and about 5 to about 40 percent by volume of the migration inhibiting materials, in an embodiment. The thicknesses of the various layers 662-665 may be selected to achieve the desired percentages. Each of the field plate layers 662-665 may be deposited by evaporation, sputtering, plating, PVD, ALD, or other suitable deposition technique(s). For example, in a particular embodiment, a first layer of either a migration inhibiting material or a gold-containing material may be deposited by evaporation over the first dielectric layer 150 (with or without an intervening adhesion layer), and a second layer of the other type of material may thereafter be deposited by evaporation over the first layer. That process may complete the stack of field plate layers, or the process may be repeated to deposit additional layers in an alternating manner. In another embodiment, a layer of migration inhibiting material may be deposited over the first dielectric layer 150 (with or without an intervening adhesion layer), a seed layer of a gold-containing material may be sputtered over the layer of migration inhibiting material, and an additional layer of gold-containing material may be plated over the seed layer. Depending on the composition of the plating bath, minor amounts of other materials (e.g., thallium or other materials) may be co-deposited with the gold-containing material during the plating process. Other deposition sequences could alternatively be employed to form the stack of field plate layers, which sequences could use any combination of evaporation, sputtering, plating, PVD, ALD, or other suitable deposition processes. After depositing the field plate layers 662-665, a lift-off technique may be performed to remove the resist layer 610 and the portions of the field plate layers 662-665 overlying the resist layer 610.

Referring now to FIGS. 2 and 7, in block 210, the field plate layers 662-665 may be exposed to a temperature that causes the field plate layers 662-665 to partially or completely combine or diffuse together. Exposure of the field plate layers 662-665 to an elevated temperature is performed simultaneously with forming second dielectric layer 170 over the field plate structure 160, in an embodiment. More specifically, the second dielectric layer 170 may be deposited using a process in which the maximum processing temperature is sufficiently high that field plate layers 662-665 completely or partially diffuse together. For example, the maximum processing temperature may exceed 150 degrees Celsius, in an embodiment, although the maximum processing temperature may be higher or lower, as well. In a specific embodiment in which the migration inhibiting material includes indium, for example, the maximum processing temperature may exceed the melting temperature of indium (e.g., about 157 degrees Celsius), above which temperature the indium will diffuse into the gold-containing material. Further, according to additional embodiments, the maximum processing temperature may or may not exceed the melting temperature of the gold-containing material, which may be significantly higher than the melting temperature of the migration inhibiting material.

The second dielectric layer 170 may be formed, for example, using PECVD, Cat-CVD, HWCVD, sputtering, or another suitable deposition technique. In an alternate embodiment, the second dielectric layer 170 may be formed using a relatively low temperature process (e.g., ALD, ICP, ECR-CVD). In such an embodiment, the field plate layers 662-665 may be permitted to remain substantially uncombined, or a separate heating process may be performed to partially or fully combine the materials of the field plate layers 662-665. In any event, the result is a field plate structure 160 in which the gold-containing material and the migration inhibiting material(s) are either integrally combined, partially combined or layered, in various embodiments. As used herein, the term "combined," as it relates to the field plate layers 662-665 means completely or partially melted together or diffused.

Finally, referring to FIG. 2 and again to FIG. 1, in block 212, source and drain electrodes 180, 182 are formed over the semiconductor substrate 110 on opposite sides of the gate electrode 140, thus establishing connections to the channel. According to various embodiments, formation of the source and drain electrodes 180, 182 may first include applying a resist layer (not shown) over the second dielectric layer 170, and patterning and etching the resist layer to form openings that expose portions of the surface of the second dielectric layer 170 through which the source and drain electrodes 180, 182 will be formed. The process may further comprise performing one or more etching steps in order to remove the exposed portions of the second dielectric layer 170 and subsequently exposed portions of the first dielectric layer 150. According to some embodiments, subsequently exposed portions of the cap layer 120 and the barrier layer 118 also may be removed to form an opening to the channel layer 116. In alternate embodiments, in which the source and drain electrodes 180, 182 extend only partially through the barrier layer 118, extend only through the cap layer 120, or are formed over and in contact with the cap layer 120, etching may be terminated at the desired point and/or the etch materials may be selected so as not to be selective to the materials of the barrier layer 118 or cap layer 120.

The materials comprising the source and drain electrodes 180, 182 may then be deposited over the resist layer and the portions of the substrate 110 that are exposed through the openings. According to various embodiments, the materials forming the source and drain electrodes 180, 182 may be deposited by evaporation, sputtering, PVD, ALD, or other suitable deposition technique(s). The method may then end.

Although various embodiments of GaN-based transistors that include field plates that are resistant to field plate material migration have been described in detail above, it is to be understood that the inventive subject matter extends beyond GaN-based transistors that include field plates. For example, besides field plates, embodiments of other types of conductive structures (e.g., transmission lines, ohmic contacts, portions of Schottky contacts, electrodes, filled vias, and so on) with gold-containing materials and migration inhibiting materials are intended to be included within the scope of the inventive subject matter. In addition, besides GaN-based transistors, embodiments of non-GaN based transistors and other types of devices that include conductive structures with gold-containing materials and migration inhibiting materials also are intended to be included within the scope of the inventive subject matter. As one non-limiting example, an embodiment may include a GaAs substrate with an overlying dielectric material (e.g., SiN) upon which a conductive structure is formed that includes a migration inhibiting material (e.g., a layer of TiW) underlying a plated gold-containing structure. In addition, besides field plates that include gold-containing materials, the inventive subject matter also encompasses embodiments of devices with field plates that include non-gold-containing materials with one or more migration inhibiting materials. Those of skill in the art would understand, based on the description herein, that the concepts of the inventive subject matter could be applied to a wide variety of other types of conductive structures implemented in various types of devices that are based on various semiconductor types, and such alternate embodiments are intended to be included within the scope of the inventive subject matter.

An embodiment of a transistor includes a semiconductor substrate, spaced-apart source and drain electrodes coupled to the semiconductor substrate, a gate electrode coupled to the semiconductor substrate between the source and drain electrodes, a dielectric layer over the gate electrode and at least a portion of the semiconductor substrate, and a field plate structure over the dielectric layer. The field plate structure comprises a gold-containing material and one or more migration inhibiting materials. According to a further embodiment, the one or more migration inhibiting materials are selected from indium, nickel, chromium, molybdenum, niobium, titanium nitride, titanium tungsten, and titanium tungsten nitride.

Another embodiment of a transistor includes a GaN based semiconductor substrate, spaced-apart source and drain electrodes coupled to the semiconductor substrate, a gate electrode coupled to the semiconductor substrate between the source and drain electrodes, a dielectric layer over the gate electrode and at least a portion of the semiconductor substrate, and a field plate structure over the dielectric layer. The field plate structure comprises a gold-containing material and one or more migration inhibiting materials selected from indium, nickel, chromium, molybdenum, niobium, titanium nitride, titanium tungsten, and titanium tungsten nitride.

An embodiment of a method of fabricating a transistor includes the steps of forming a gate electrode over a semiconductor substrate, forming a dielectric layer over the gate electrode and at least a portion of the semiconductor substrate, and forming a field plate structure over the dielectric layer, where the field plate structure comprises a gold-containing material and one or more migration inhibiting materials.

The terms "first," "second," "third," "fourth" and the like in the description and the claims are used for distinguishing between elements and not necessarily for describing a particular structural, sequential or chronological order. It is to be understood that the terms so used are interchangeable under appropriate circumstances. Furthermore, the terms "comprise," "include," "have" and any variations thereof, are intended to cover non-exclusive inclusions, such that a circuit, process, method, article, or apparatus that comprises a list of elements is not necessarily limited to those elements, but may include other elements not expressly listed or inherent to such circuit, process, method, article, or apparatus. The term "coupled," as used herein, is defined as directly or indirectly connected in an electrical or non-electrical manner.

While the principles of the inventive subject matter have been described above in connection with specific systems, apparatus, and methods, it is to be clearly understood that this description is made only by way of example and not as a limitation on the scope of the inventive subject matter. The various functions or processing blocks discussed herein and illustrated in the Figures may be implemented in hardware, firmware, software or any combination thereof. Further, the phraseology or terminology employed herein is for the purpose of description and not of limitation.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A transistor comprising:
   a semiconductor substrate;
   spaced-apart source and drain electrodes coupled to the semiconductor substrate;
   a gate electrode coupled to the semiconductor substrate between the source and drain electrodes;
   a dielectric layer over the gate electrode and at least a portion of the semiconductor substrate; and
   a field plate structure over the dielectric layer, wherein the field plate structure comprises multiple layers of a gold-containing material and one or more layers of indium interleaved with the multiple layers of the gold-containing material.

2. The transistor of claim 1, wherein the field plate structure includes the gold-containing material in a range of 60 to 95 percent by volume, and includes the indium in a range of 5 to 40 percent by volume.

3. The transistor of claim 1, wherein the field plate structure at least partially overlaps the gate electrode.

4. The transistor of claim 1, wherein the field plate structure is adjacent to but does not overlap the gate electrode.

5. The transistor of claim 1, wherein the semiconductor substrate is gallium nitride based.

6. A transistor comprising:
   a gallium nitride based semiconductor substrate;
   spaced-apart source and drain electrodes coupled to the semiconductor substrate;
   a gate electrode coupled to the semiconductor substrate between the source and drain electrodes;

a dielectric layer over the gate electrode and at least a portion of the semiconductor substrate; and a field plate structure over the dielectric layer, wherein the field plate structure comprises multiple layers of a gold-containing material and one or more layers of indium interleaved with the multiple layers of the gold-containing material.

7. The transistor of claim 6, wherein the field plate structure includes the gold-containing material in a range of 60 to 95 percent by volume, and includes the indium in a range of 5 to 40 percent by volume.

8. A method of fabricating a transistor, the method comprising the steps of:

forming a gate electrode over a semiconductor substrate;

forming a dielectric layer over the gate electrode and at least a portion of the semiconductor substrate; and forming a field plate structure over the dielectric layer, wherein forming the field plate structure comprises forming a stack of layers by depositing, by evaporation, a first indium layer, depositing a first gold-containing material layer over the first indium layer, depositing, by evaporation, a second indium layer over the first gold-containing material layer, and depositing a second gold-containing material layer over the second indium layer.

9. The method of claim 8, wherein forming the field plate structure further comprises:

heating the stack of layers to a temperature that causes the first and second gold-containing material layers and the first and second indium layers to partially combined together.

10. The method of claim 8, further comprising:

forming spaced-apart source and drain electrodes coupled to the semiconductor substrate on either side of the gate electrode.

11. A transistor comprising:

a semiconductor substrate;

spaced-apart source and drain electrodes coupled to the semiconductor substrate;

a gate electrode coupled to the semiconductor substrate between the source and drain electrodes;

a dielectric layer over the gate electrode and at least a portion of the semiconductor substrate; and a field plate structure over the dielectric layer, wherein the field plate structure comprises multiple layers of a gold-containing material and multiple layers of indium, wherein the multiple layers of the gold-containing material are interleaved with the multiple layers of indium.

* * * * *